United States Patent [19]

Kumar et al.

[11] Patent Number: 5,431,869
[45] Date of Patent: Jul. 11, 1995

[54] PROCESS FOR THE PREPARATION OF POLYCRYSTALLINE SILICON INGOT

[75] Inventors: Singh P. Kumar; Prem Prakash, both of New Delhi, India

[73] Assignee: Council of Scientific & Industrial Research, New Delhi, India

[21] Appl. No.: 3,455

[22] Filed: Jan. 12, 1993

[51] Int. Cl.$^6$ .............................................. B29C 33/56
[52] U.S. Cl. ........................................ 264/85; 264/25; 264/338
[58] Field of Search ........................ 264/85, 338, 25; 164/472

[56] References Cited

U.S. PATENT DOCUMENTS

| | | | |
|---|---|---|---|
| 4,243,471 | 1/1981 | Ciszek et al. | 156/616 |
| 4,264,052 | 4/1981 | Radtke | 249/115 |

FOREIGN PATENT DOCUMENTS

| | | | |
|---|---|---|---|
| 5826019 | 2/1983 | Japan | C01B 33/02 |
| 62-108515 | 5/1987 | Japan | H01L 21/18 |

OTHER PUBLICATIONS

Article entitled "Growth of Silicon Ingots by Hem For Photovoltaic Applications" by C. P. Khattak and F. Schmid, pp. 153 to 183, Silicon Processing For Photovoltaics II, Elsevier Science Publishers B.V., 1987.

Article entitled "Polycrystalline Silicon For Solar Cell By The Technique of Directional Solidification" by A. Z. Lin, et al. of General Research Institute of Non-Ferrous Metals, Bejing, China, pp. 1375-1380.

Article entitled "A Reusable Mold in Directional Solidification For Silicon Solar Cells" by Takeshi Saito, et al. of Microelectronics Research Lab. NEC Corporation, Japan, pp. 337 to 345.

Article entitled "Directionally Solidified Solar-Grade Silicon Using Carbon Crucibles" by T. F. Ciszek, et al., Journal of Crystal Growth 46 (1979) pp. 527-533.

Article entitled "Selection of A Crucible Material In Contact With Molten Silicon" by G. Revel, et al. Proceedings of 5th EC Photovoltaic Solar Energy Conference (1983) pp. 1037-1042.

Article entitled "Liquid Encapsulated Bridgman (LEB) Method for Directional Solidification of Silicon Using Calcium Chloride" by P. S. Ravishankar, Journal of Crystal Growth 94 (1989) pp. 62-68.

Article entitled "Molding and Directional Solidification of Solar-Grade Silicon Using An Insulating Molten Salt" by O. Minster J. Granier et al. Journal of Crystal Growth 82 (1987) pp. 155-161.

"Progress in Ingot and Foil Casting of Silicon", D. Helmreich & E. Sirtl, Journal of Crystal Growth, vol. 79 (1986), pp. 562-571.

"Silicon Processing for Photovoltaic", vol. 2, edited by C. P. Khattak and K. V. Ravi (Elsevier Science Publ. Ltd., B.V. 1987), p. 153.

Article entitled "Advances in Solid State Physics" by B. Authier, pp. pp. 1-17 from Lectures of the German Physical Society, Freudenstadt.

Primary Examiner—James Derrington
Attorney, Agent, or Firm—Michael D. Bednarek; Marks & Murase

[57] ABSTRACT

This invention relates to a process for the preparation of polycrystalline silicon ingots by providing a first layer of coating on the inside walls of a mold with a slurry of silicon nitride powder in an organic binder dissolved in a solvent; charging the said coated mold with silicon pieces along with calcium chloride or/and calcium fluoride; heating the mold to a temperature in the range of 1420°-1500° C. so as to melt the silicon, by keeping the mold inside the furnace; bringing down the temperature of the mold to a temperature 5°-10° C. above the melting point of silicon; withdrawing the mold containing the melt downwardly and slowly from the hot zone of the furnace so that the solidification of the melt starts from the bottom of the mold and proceeds towards the top as the withdrawal continues till all the melt solidifies; cooling the mold to the room temperature under inert atmosphere and removing the polycrystalline silicon ingot from the mold.

11 Claims, No Drawings

PROCESS FOR THE PREPARATION OF POLYCRYSTALLINE SILICON INGOT

This invention relates to an improved process for the preparation of polycrystalline silicon ingot. The wafers obtained by slicing the ingots prepared by the process of the present invention are useful for making silicon solar cells and other semiconductor devices. In the past there has been many attempts to develop new processes for manufacturing silicon ingots for photovoltaic applications.

Conventionally, polycrystalline silicon ingots are grown using directional solidification techniques. Reference may be made to the papers entitled "Growth of Silicon Ingots by HEM for Photovoltaic Applications", by F. Schmid and C. P. Khattak in Silicon Processing for Photovoltaic, Vol. 2, ed. C. P. Khattak and K. V. Ravi (Elsevier Science Pub. BV 1987) p. 153, "Polycrystalline Silicon for Solar Cells by the Technique of Directional Solidification", by A. Z. Lin, Z. Q. Fan, H. Y. Shen and L. Tang, in the conference record of the 17th Photovoltaic Specialists Conference, U.S.A. 1984 (IEEE, New York 1984) p. 1375, "A Reusable Mold in Directional Solidification for Silicon Solar Cells", by T. Saito, A. Shimura and S. Ichikawa, in Solar Energy Materials Vol. 9 (1983) p. 337 and "Directional Solidification Solar Grade Silicon Using Carbon Crucible" by T. F. Cizsek, G. H. Schwuttke and K. N. Yang, in J. Cryst. Growth Vol. 46 (1979) p. 527. A process for obtaining polycrystalline silicon using directional solidification technique is known from U.S. Pat. No. 4,243,471. In these techniques, the silicon is melted inside a mold and then the solidification of the melt is facilitated by extracting heat from the bottom of the mold either by cooling the bottom or by withdrawing the mold downwards from the hot zone. These techniques for the growth of polycrystalline silicon have attracted considerable attention due to their simplicity, high throughput and low production cost. However, there are a number of difficulties experienced in employing the directional solidification techniques. The foremost difficulty is that, in molten state, the high reactivity of silicon results in contamination of the melt by the impurities of the mold. The solidifying melt adheres to the inner walls of the mold and consequently ingot and/or mold cracks due to the difference in their coefficients of thermal expansion (CTE). Selection of a mold material for the growth of silicon ingot becomes more difficult because of the volume increase of silicon by 9% on solidification. Reference is made to the publication titled "Selection of Crucible Material in Contact With Molten Silicon" by G. Revel et al. in the Proceedings of 5th European Communities Photovoltaic Solar Energy Conference, 1983, p. 1037.

The search for a viable cost effective mold material for the production of silicon particularly for substrates for solar cells continues to be an active area of research. The basis of selection of the mold material also involves cost, machinability and purity. The common mold materials for silicon are fused silica (also known as quartz) and graphite. Quartz is extensively used as mold because of its availability in very high purity and comparatively lower reactivity with molten silicon but at temperatures near the melting point of silicon, it exhibits a number of disadvantages, i.e., softness at 1450° C. which results in deshaping of the mold, gradual devitrification, fusion of solidifying silicon with quartz, and reaction with silicon to form volatile silicon mono-oxide. Indeed these restrict use of the quartz mold to one time only. The graphite is usually chosen for molds because of the ease of machining, its stability at high temperature and availability in high purity.

Quartz molds are invariably used to grow silicon single crystals using the Czochralski (CZ) process where the entire melt is pulled out of the mold. However, the quartz molds cannot be used in directional solidification technique to grow polycrystalline silicon ingots where the melt is solidified inside the mold in a controlled manner because at high temperatures molten silicon reacts with quartz and during solidification both adhere with each other. Consequently, due to difference in CTE of the quartz and the silicon both mold and ingot crack during the cooling cycle. A number of alternatives have been suggested to solve this problem. For example, in the heat exchanger method (HEM), graded quartz molds are being used to grow polycrystalline silicon ingots. Reference may be made to "Growth of Silicon Ingots by HEM for Photovoltaic Applications", by F. Schmid and C. P. Khattak in Silicon Processing for Photovoltaic, Vol. 2, ed. C. P. Khattak and K. V. Ravi (Elsevier Science Pub. BV 1987), p.153. Saito et al used a protective coating of silicon nitride powder on the inner walls of the quartz mold. Reference may be made to "A Reusable Mold in Directional Solidification for Silicon Solar Cells", by T. Saito, A. Shimura and S. Ichikawa, in Solar Energy Materials Vol. 9 (1983) p.337. Consequently, the reaction of the mold with molten silicon was completely avoided and crack free silicon ingots were successfully grown. Shanker reported in his paper titled "Liquid Encapsulated Bridgman (LEB) Method for Directional Solidification of Silicon Using Calcium Chloride" J. Cryst. Growth Vol. 94 (1989) p.62, reported a new process to grow polycrystalline silicon ingots in quartz molds using directional solidification methods. In this process encapsulation of molten silicon by calcium chloride is used to prevent molten silicon to come in contact with the mold.

Graphite has begun to find use as molds in polycrystalline silicon ingot growth after the feasibility of the use of polycrystalline material for photovoltaic application has been demonstrated. See the paper titled "Polycrystalline Silicon with Columnar Structure" by B. Authier in Festkorperproblem Vol.18 (1978) p.1. However, graphite mold also reacts with molten silicon and as a result strong bonding between them occurs. Many workers have used bare graphite molds to grow silicon ingots but for each growth run one mold was sacrificed. Reference may be made to the papers titled "Polycrysalline Silicon for Solar Cells by the Technique of Directional Solidification", by A. Z. Lin, Z. Q. Fan, H. Y. Shen and L. Tang, in the conference record of the 17th Photovoltaic Specialists Conference, U.S.A. 1984 (IEEE, New York 1984) p.1375 and "Directional Solidification Solar Grade Silicon Using Carbon Crucible" by T. F. Cizsek, G. H. Schwuttke and K. N. Yang, in J. Cryst, Growth Vol. 46 (1979) p.527.

Saito et al in the same paper, mentioned above, have reported a protective coating for graphite molds for their repetitive use. Similar process developed at Osaka Titanium Manufacturing Company has been made the subject matter of Japanese Patent No. 58-26019. In their process, first, a dense and hard layer of silicon carbide (about 120 micron thick) is deposited by chemical vapor deposition (CVD) of silane and methane on a graphite mold end then a coating of silicon nitride powder is applied which acted as a mold releasing agent. However, the necessity of deposition of CVD silicon carbide and silicon nitride each time on the inner walls of the mold is a big disadvantage that makes the process costly and cumbersome, and the very purpose of its development is defeated.

Minister et al (in the paper title "Molding and Directional Solidification of Solar Grade Silicon Using an Insulating Molten Melt" by O. Minster, J. Granier, C. Potard and N. Eustanthopoulos, in J. Cryst. Growth, Vol.82 (1987) p. 155) reported a technique to grow polycrystalline silicon ingot in graphite molds by encapulating the silicon melt by equimolar composition of calcium and magnesium fluorides. Due to high surface tension of the encapsulent, the molten silicon coalesced into a spherical shape. To make the ingot surface flat, a movable graphite piston was applied on top of the melt. This puts an stringent requirement on the pressure that may result in cracking of the ingot and/or the mold. It is, therefore, difficult to upgrade this process for growing large volume ingots.

In Japanese Patent No. 62-108515, a process for the growth of polycrystalline silicon ingots in graphite mold has been described. In this process the mold is made by assembling five graphite plates constituting four walls and the bottom of the mold with the help of screws. The inner walls of the mold are coated either with oxide, nitride or carbide of silicon or with the combination of two or more of these materials. Such a layer prevents molten silicon to come in contact with graphite mold and consequently, ingot can be detached cleanly from the mold by dismantling it. In this process, the mold can be put for reuse after reassembling and coating.

In this patent a coating of silicon nitride on the inner walls of the graphite mold alone is exploited to facilitate release of the ingot from the mold. It is observed that silicon nitride coating alone on graphite fails miserably even in the case of single piece mold. Another draw back in the process is that, in general, the coating of silicon carbide alone or in combination with other components as used in the said process may add silicon carbide in the form of precipitates into the grown silicon ingots because of its immediate contact with the silicon melt. The presence of silicon carbide is deleterious to the device formed on the wafers obtained from these ingots. Moreover, silicon carbide deposition by DVD is a cumbersome and expensive process. More importantly, it is difficult to have it on large dimension molds.

We understand that the different a number of manufactures of polycrystalline silicon ingots are using different type of molds. However, the most commonly used mold materials are quartz and graphite. The former can be used only once, whereas, there exists a possibility of using the latter a number of times.

The main objective of present invention is to provide an improved process for the production of polycrystalline silicon ingots by which the mold used in the growth of polycrystalline silicon ingot can be reused.

The main finding of the present invention is that it is made possible to grow a polycrystalline silicon ingot in a graphite mold using the invented process to get the ingot released clearly and cleanly from the graphite mold and reuse the mold for further experiments. This has been achieved by providing a two layer protective coating between the melt and the inner walls of the graphite mold, the first layer consisting of a silicon nitride coating which is applied on the inner walls of the graphite mold the second layer being in the form of an in-situ molten halides of alkaline earth elements layer between the molten silicon and the silicon nitride coating. The alkaline earth halides are selected from calcium chloride, calcium fluoride, magnesium fluoride etc. alone or a combination of two or more of these materials. Preferably it may be calcium chloride alone or calcium chloride is taken as a major component if used in combination with other materials. It not only ensures the formation of a good second protective layer for molten silicon but the possibility of transfer of stress to the mold resulting from volume increase of silicon during solidification is also alleviated. Consequently, the silicon melt is solidified such that the solidified ingot does not ever come in contact with the inner surface of the graphite mold. Additionally this layer provides a slagging effect for certain impurities.

It is to be noted here that although the single layer of both these materials (i.e. either of silicon nitride or of calcium chloride at a time) has been used successfully on quartz molds (as reported by Saito et al and Shanker respectively) but it fails miserably in case of graphite molds.

Accordingly, the present invention provides an improved process for the preparation of polycrystalline silicon ingots which comprises (a) providing a first layer of coating on the inside walls of a graphite mold with a slurry of silicon nitride powder in an organic binder, (b) charging the said coated graphite mold with silicon pieces along with calcium chloride or with a combination of two or more of calcium chloride, calcium fluoride and magnesium fluoride, (c) heating the mold to a temperature in the range of 1420°–1500° C. so as to melt the silicon, by keeping the mold inside a furnace, (d) bringing down the temperature of the mold to a temperature 5°–10° C. above the melting point of silicon, (e) withdrawing the mold containing the melt downwardly and slowly from the hot zone of the furnace so that the solidification of the melt starts from the bottom of the mold and proceeds towards the top as the withdrawal continues till all the melt solidifies, (f) cooling the mold to the room temperature under inert atmosphere and (g) removing the polycrystalline silicon ingot formed from the mold.

The mold can be made in different shapes (i) it may be a single piece with or without hairline crack (ii) it may consist of two half cylinders put together and mounted on a circular base with a groove or (iii) it may be of square cross-section with sides and bottom made of plates which are assembled together to make the mold.

The organic chemical used for making the slurry of silicon nitride powder may be selected from polyvinyl alcohol or polyvinyl acetate or polyvinyl butyrate. The ratio of silicon nitride to this binder may range between 30 to 60% by weight. If other alkaline earth halide is to be added along with calcium chloride, its amount may less than 40 wt. % of the calcium chloride. The thickness of silicon nitride layer may vary from 150 to 300 micron. The amount of calcium chloride to be added may vary from 3 to 10 wt. % of silicon charge. The inert atmosphere may be maintained by argon or nitrogen. The lowering rate of the molds for the directional solidification of silicon may vary from 0.05 to 1.0 mm/min.

A homogenous paste of silicon nitride powder is prepared by mixing it with the organic chemical (i.e. binder). It is required that the paste has a good adhesion with graphite and the binder can be removed after the coating. Polyvinyl alcohol (PVA) in water is the preferred binder. The advantage of PVA is that it can be removed by low temperature heat treatment of the coated film. The silicon nitride powder may be 99.8% pure and the particle size may range between 300–350 mesh. The powder is mixed in PVA solution and the paste is then coated on the walls of the mold by spray painting or by with a fine flat brush. It has been observed that the silicon nitride coating of thickness between 150–300 micron is suitable for protecting the graphite mold from the molten silicon for several hours.

Calcium chloride has low melting point (782° C.) and has sufficiently low vapor pressure (20 torr) at the melting point of the silicon. Additionally, its density in liquid state is marginally higher than that of molten silicon. Calcium chloride has high chemical inertness with molten silicon and is insoluble in silicon. Accordingly, calcium chloride is preferred for second layer. It has been observed that the molten calcium chloride prefers to migrate to the silicon surface, the property which is exploited here. From the material quality point of view calcium impurity does not have a deleterious effect on the minority carrier lifetime of the silicon. Being a hygroscopic material, it absorbs water which aids in removing the ingot from the mold. It has been found that larger grains in the silicon ingot can be obtained by the use of calcium chloride. It is expected that this procedure can accrue considerable cost savings in industrial practice as the mold constitutes a high percent of cost per ingot grown by directional solidification.

To grow polycrystalline silicon ingots molds of various shapes and sizes have also been fabricated. Experiments showed that the growth could be performed in split molds consisting of two or more parts. This has made the release of the ingot a very clean and easy process. All sections of the molds are machined from the high purity graphite which has density preferably $>1.77$ g/cm$^3$. The coefficient of thermal expansion of this grade of graphite is compatible with that of silicon below 600° C. It is to be noted that above this temperature silicon deforms plastically and therefore in $T>600°$ C. range CTE is not very critical. The molds are assembled by putting together their all parts with the help of screws. Some molds are kept together by putting parts constituting the molds in slots cut into the bottom plate. Following are the details of the different design of split molds used in the experiments.

Mold No. 1

A square cross-section mold was fabricated from 5 graphite plates which were kept together with the help of screws. The mold could be demounted be removing the screws.

Mold No. 2

A circular cross-section mold of 75 mm diameter consisted of a slotted bottom plate, a slotted top annular disc and a cylinder. The cylinder could be fitted into the slots of the bottom plate and the top disc. The cylinder had a hair line slit running throughout the height so that it could be opened to remove the ingot. In some molds bottom plate was an unslotted disc which was fitted with the help of the screws.

Mold No. 3

This was similar to the Mold#2 except that the cylinder consists of two equal halves.

Growth of Polycrystalline Silicon Ingots in Reusable Molds

Using a graphite mold with a two layer protective coating, shaped ingots of silicon were grown with directional solidification method. A 20 KW resistance heated directional solidification system was used. The graphite mold was kept inside a supporting cup made of graphite which is in turn placed on a graphite platform. The whole assembly is mounted on a double walled water cooled shaft which can move vertically. The shaft serves dual purpose during the growth, firstly it is used for the upward and downward movement of the mold and secondly it acts as a heat sink and consequently, helps in directional solidification of the melt. The mold can be lowered by moving the shaft downwards with the help of a motor at a controlled rate to facilitate directional solidification. The solidification of melt proceeds from the bottom to the top.

In the growth experiments semiconductor grade polycrystalline silicon chunks were used as charge. For example, in a typical growth run in an 85 mm diameter graphite mold, 500 gm charge of silicon and requisite amount of dopant (for example boron for p-type or phosphorous for n-type material) to produce to produce polycrystalline silicon of desired resistivity, is placed along with calcium chloride in the range of 3–10 weight percent of silicon. The mold is positioned within the heater in such a way that the bottom of the mold is in the hottest region. Pressurized water (normally at a temperature lass than 20° C.) is circulated in the shaft. Prior to the heating, the chamber is evacuated to $10^{-3}$ torr and flushed by high purity argon. The charge is heated slowly until the melting process is completed. The mold is lowered at a rate of 0.3 mm/min. After completion of lowering, the power is reduced slowly and is then turned off. The mold containing the ingot is taken out from the furnace after it has cooled to room temperature. As the bottom and lateral parts of the mold are dismounted the molded ingot is found totally isolated from the mold, intact and free of cracks. Same molds are reused for growing other ingots after giving each time a fresh but thin silicon nitride coating to it.

A number of ingots were grown, for the first time, using silicon nitride/calcium chloride coating on the same graphite mold and each ingot came out as fine as the first one. In all a large number of ingots of 55–85 mm diameter or 50 mm $\times$ 50 mm cross-section (limited by our furnace dimensions) are grown using the three different kinds of molds discussed earlier. Larger size ingots should be expected to be grown using larger size molds in bigger directional solidification systems.

A vertical section of a cylindrical ingot prepared by the process of the present invention showed that the grains are columnar. Undesirable large concentration of small grains near the walls of the mold are not seen. This is indicative of the fact that the heat was extracted primarily through the bottom of the mold and calcium chloride buffer layer had suppressed undesirable nucleation from the mold walls or from particles of silicon nitride coating.

The resistivity viz. of a boron doped p-ingots has been found to be uniform throughout the ingot length except near the top and the bottom ends. The higher resistivity at the top region may be attributed to the rejection of impurities by the solidifying silicon to the melt and concomitant increased effective compensation of p-type dopant impurity with the n-type impurities in the last solidified (top) end of the ingot which might have taken place during solidification. The resistivity within a wafer is uniform.

The quality of polycrystalline silicon ingots grown by directional solidification in reusable graphite molds is good in the sense that the performance of solar cells made from them is comparable to those made from the ingots grown in silicon nitride coated quartz molds.

This process is potentially commercially viable due to following reasons:

(a) Since the cost of the mold is substantial in comparison with the ingot, the reuse of the mold has a large impact on production cost of polycrystalline silicon ingots.

(b) It has been demonstrated that molds made with the sheets of graphite can be used with the invented mold releasing coating. Conventionally, the mold is fabricated from the rods of graphite and a lot of material is wasted during fabrication. Thus the use of graphite plates instead of rods reduces the cost of the mold and also avoids the technical problems of machining large molds.

(c) The cost of the coating is far too small in comparison with that of a quartz or a graphite mold, more so, if the mold size is large.

We claim:

1. An improved process for the preparation of polycrystalline ingots which comprises:
    (a) providing a first layer of coating on the inside walls of a mold with a slurry of silicon nitride powder in an organic binder dissolved in a solvent;
    (b) charging the said coated mold with the silicon pieces along with at least one halide of alkaline earth elements;
    (c) heating of the mold to a temperature in the range of 1420°–1500° C. as to melt the silicon, by keeping the mold inside a furnace designed for directional solidification;
    (d) bringing down the temperature of the mold to a temperature 5°–10° C. above the melting point of silicon,
    (e) withdrawing the mold containing the melt downwardly and slowly from the hot zone of the furnace so that the solidification of the melt starts from the bottom of the mold and the proceeds towards the top as the withdrawal continues until the melt solidifies;
    (f) cooling the mold to the ambient temperature under inert atmosphere and;
    (g) removing the polycrystalline silicon ingot from the mold.

2. An improved process as claimed in claim 1, wherein the mold used is made of a material which has a melting point higher than the melting point of silicon and is in the form of a single or multiple pieces.

3. An improved process as claimed in claim 1, wherein the organic binder used is selected from a group consisting polyvinyl alcohol, polyvinyl acetate and polyvinyl butyrate.

4. An improved process as claimed in claim 1, wherein the solvent for the organic binder is water.

5. An improved process as claimed in claim 1, wherein the solvent for organic binder is an organic solvent selected from the group consisting of alcohol, esters, acetone, and benzene.

6. An improved process as claimed in claim 1, wherein the thickness of the first layer varies from 150 to 300 micron.

7. An improved process as claimed in claim 1, wherein the organic binder added to the silicon nitride powder ranges from 30 to 60% of the weight of the silicon nitride powder.

8. An improved process as claimed in claim 1, wherein the amount of alkaline earth halide ranges from 3 to 10% of the silicon charge by weight.

9. An improved process as claimed in claim 8, wherein said alkaline earth halide includes calcium chloride.

10. An improved process as claimed in claim 1, wherein the inert atmosphere inside the melting furnace is maintained by employing an inert gas.

11. An improved process as claimed in claim 10, wherein said inert gas is argon.

* * * * *

UNITED STATES PATENT AND TRADEMARK OFFICE
CERTIFICATE OF CORRECTION

PATENT NO. : 5,431,869
DATED : July 11, 1995
INVENTOR(S) : Parakram Kumar SINGH et al.

It is certified that error appears in the above-indentified patent and that said Letters Patent is hereby corrected as shown below:

ON THE TITLE PAGE
Item [75], inventors should read "Parakram Kumar SINGH, Prem PRAKASH, Ram KISHORE, Shiv Nath SINGH, and Bijoy Kishore DAS, all of New Delhi, India".

Signed and Sealed this

Fifth Day of December, 1995

Attest:

BRUCE LEHMAN

Attesting Officer

Commissioner of Patents and Trademarks